United States Patent [19]
Selna et al.

[11] Patent Number: 5,831,890
[45] Date of Patent: Nov. 3, 1998

[54] SINGLE IN-LINE MEMORY MODULE HAVING ON-BOARD REGULATION CIRCUITS

[75] Inventors: Erich H. Selna, Mountain View; Tak Eng, San Jose, both of Calif.

[73] Assignee: Sun Microsystems, Inc., Mountain View, Calif.

[21] Appl. No.: 766,979

[22] Filed: Dec. 16, 1996

[51] Int. Cl.$^6$ ..................................... G11C 5/04
[52] U.S. Cl. .............. 365/51; 365/63; 365/226; 365/189.09
[58] Field of Search .............. 365/226, 189.09, 365/51, 63

[56] References Cited

U.S. PATENT DOCUMENTS 5,532,954  7/1996  Bechtolsheim et al. .................. 365/52

*Primary Examiner*—David C. Nelms
*Assistant Examiner*—Andrew Q. Tran
*Attorney, Agent, or Firm*—Blakely Sokoloff Taylor & Zafman

[57] ABSTRACT

A single in-line memory module (SIMM) having on-board regulation circuits is disclosed. The present invention includes a plurality of inputs. These inputs include a first reference voltage signal. The present invention employs a plurality of memory elements that are arranged to form a datapath having a predetermined width. These memory elements operate at a second reference voltage signal that is different from the first reference voltage signal received by the SIMM. On-board regulation circuits are provided to translate the first reference voltage signal into the second reference voltage signal so that the memory elements of the SIMM can use the first reference voltage signal. A driver for providing an interface between the memory elements and a computer system is also provided. This driver may also operate at the second reference.

22 Claims, 8 Drawing Sheets

200 SIGNAL LAYER ———

202 POWER ———

204 SIGNAL LAYER ———

206 GND ———

208 GND ———

210 SIGNAL LAYER ———

220 POWER ———

224 SIGNAL LAYER ———

Fig. 3

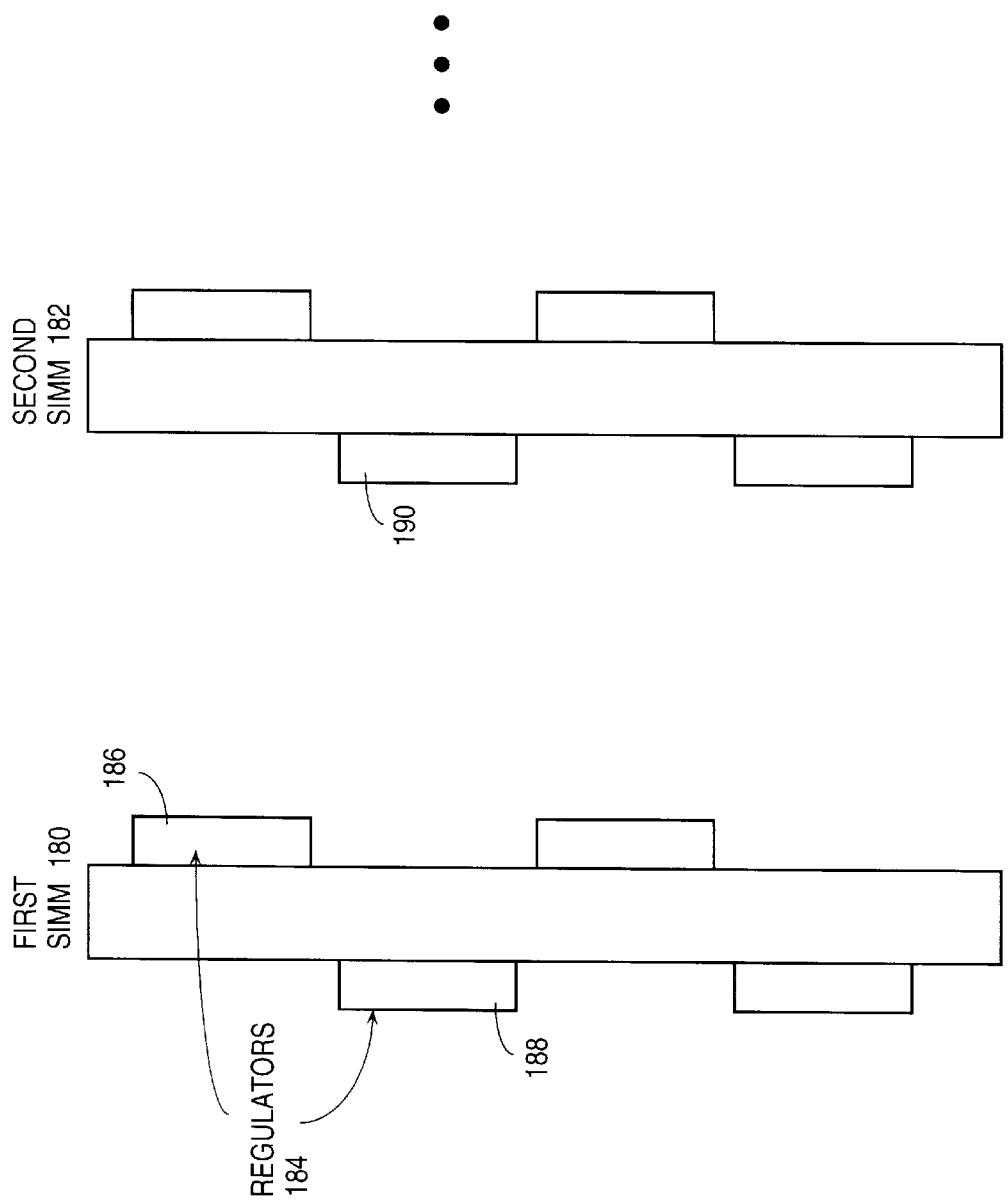

SINGLE IN-LINE MEMORY MODULE HAVING ON-BOARD REGULATION CIRCUITS

BACKGROUND OF THE INVENTION

1. Field of the Invention

The present invention relates to the field of computer systems and memory hardware. More particularly, the present invention relates to modular circuit boards which may be combined to form a memory structure within a computer system.

2. Art Background

Single in-line memory modules (SIMMs) are compact circuit boards designed to accommodate surface mount memory chips. SIMMs were developed to provide compact and easy to manage modular memory components for user installation in computer systems designed to accept such SIMMs. SIMMs generally are easily inserted into a connector within the computer system, and thereby derives all necessary power, ground, and logic signals therefrom.

A SIMM typically comprises a multiplicity of memory chips (e.g., random access memory (RAM)) that are mounted to a printed circuit board. Depending on the user's needs, the memory chips may be dynamic RAM (DRAM), non volatile static RAM (SRAM) or video RAM (VRAM). Because DRAM memories are larger and cheaper than memory cells for SRAMSs, DRAMs are widely used as the principal building block for main memories in computer systems. SRAM and VRAM SIMMs have more limited applications for special purposes such as extremely fast cache memories and video frame buffers, respectively. Because DRAMs form the largest portion of a computer system memory, it is desirable that these memory modules flexibly accommodate the computation needs of a user as a user's requirements change over time. Moreover, it is desirable that the installation of the SIMMs to the computer system be relatively easy for a user, specifically in terms of configuring a SIMM within a particular memory structure. For example, SIMMs have generally been designed to provide memory increments of one or more megabytes (MB). In the past, all the SIMM components (i.e., the surface mount chips on the printed circuit board) operated at the pre-determined reference voltage of the computer system. For example, in a 5V environment, all the components of a SIMM operate at the 5V reference voltage.

With the advent of computer components that operate at lower operating voltages (e.g., 3.3V), the prior art SIMM architectures could not employ these chips that operate at a different reference voltage because of the incompatibility of operating voltages.

Thus, the prior art SIMM architectures cannot take advantage of the computer components that operate at these lower voltages. Specifically, the prior art SIMM architectures forego the lower power consumption of these new low-powered components. The loss of power savings due to the inability to incorporate computer components having a lower power supply voltage is not insubstantial considering that SIMM architecture typically includes multiple (e.g., 18) memory chips.

As will be described in more detail in the following detailed description, the present invention provides, among other attributes, on-board regulation circuitry that allows the SIMM to accommodate computer components operating at a reference voltage that is different from the power supply voltage of the computer system.

SUMMARY OF THE INVENTION

A single in-line memory module (SIMM) having on-board regulation circuits is disclosed. The present invention includes a printed circuit board having a plurality of memory elements mounted thereto. These memory elements are arranged to form a data path having a predetermined width. The present invention further includes an on-board driver to buffer and drive signals received from a computer system via a connector structure. These signals include a first reference voltage signal which is provided by the computer system. In addition, electrically conducted traces are routed on the circuit board in such a manner to reduce loading and trace capacitance to minimize signal skew to the distributed memory elements. As noted, the present invention includes a connector structure for interfacing between the computer system and the SIMM. The connector structure receives electrical traces from both sides of the circuit board for enhanced functionality. The SIMM is installed in complementary sockets, one SIMM at a time, to provide memory expansion in full width increments. The memory elements and on-board driver operate at a second reference voltage (i.e., they operate at a power supply voltage that is different from the supply voltage of the computer system). The SIMM of the present invention further includes a plurality of regulation circuits for translating the first reference voltage signal of the computer system into the second reference voltage signal that is usable by the memory elements and the on-board driver. The present invention utilizes a unique combination of component placement, printed circuit layer stacking and signal routing to provide a voltage-regulated SIMM architecture.

BRIEF DESCRIPTION OF DRAWINGS

The present invention is illustrated by way of example and not limitation in the figures of the accompanying drawings in which like references indicate similar elements.

FIG. 3 illustrates the layer stacking for the printed circuit board employed in one embodiment of the present invention.

FIG. 8 illustrates a side view of multiple memory modules of the present invention that are configured in accordance with the teachings of the present invention.

DETAILED DESCRIPTION OF THE INVENTION

In the following detailed description of the present invention, numerous specific details are set forth in order to provide a thorough understanding of the present invention. However, it will be obvious to one skilled in the art that the present invention may be practiced without these specific details. In other instances, well known electrical structures and circuits are shown in block diagram form in order not to unnecessarily obscure aspects of the present invention.

U.S. Pat. No. 5,532,954, entitled "Single In-Line Memory Module," that issued on Jul. 2, 1996, and is commonly owned by the assignee of the present application, is herein incorporated by reference.

The present invention is a voltage regulated SIMM. In the preferred embodiment, the voltage regulated SIMM is a 8M×144 dynamic SIMM module having memory elements (e.g., DRAMs) that operate at a predetermined voltage reference (e.g., 3.3V), where the SIMM module operates in an environment having a predetermined voltage reference (e.g., 5V). In the preferred embodiment, the present invention includes 18 64Mb(8M×8) DRAMs in TSOP packages and one 20-bit BiCMOS line driver. Four on-board voltage regulators provide the 5V to 3.3V conversion to operate the DRAMs and the line driver. Since each regulator can generate a substantial amount of heat (e.g., over 1 watt), design tradeoffs such as thermal effects versus layout and also the layout versus signal integrity were considered. The present invention employs a unique combination of component placement, printed circuit layer stacking and signal routing to produce an optimal layout for the SIMM.

As noted previously, the SIMM has a single reference voltage as its power supply voltage. The SIMM at 5V+/−5% of the supply voltage. The SIMM further has a 200-pin connector and provides a total of 8M×144 (128 MB) of memory storage space. Appendix 1 illustrates the pin assignment of one embodiment of the present invention.

Figure 1:
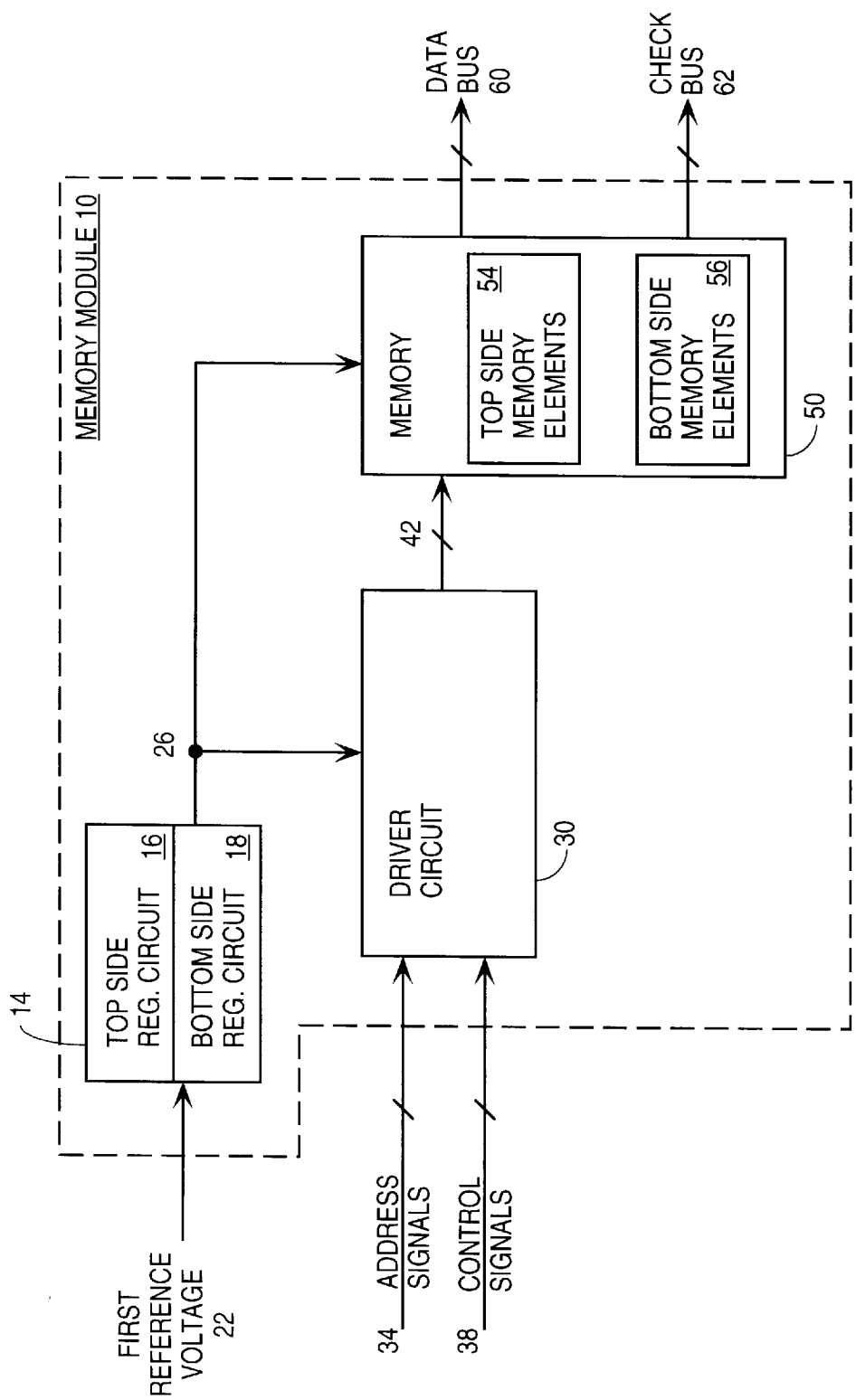
FIG. 1 illustrates a functional block diagram of one embodiment of the present invention.

FIG. 1 illustrates a functional block diagram of the present invention. The memory module 10 of the present invention includes a voltage regulation circuit 14 having a first input for receiving a first reference voltage 22 and providing as an output a second reference voltage 26. The voltage regulation circuit 14 includes a top side regulation circuit 16 and a bottom side regulation circuit 18. Each of these regulation circuits will be described in greater detail hereinafter with reference to FIG. 2. The voltage regulation circuit 14 converts the first reference voltage 22 into a second reference voltage 26.

The memory module 10 of the present invention also includes a driver circuit 30 that is coupled to the voltage regulation circuit 14. The driver circuit 30 includes a first input for receiving the second reference voltage 26. The driver circuit 30 is adapted to operate at the second reference voltage 26 and not at the first reference voltage 22. The driver circuit 30 includes an input for receiving address signals 34 and an input for receiving control signals 38. These control signals 38 may include row address strobe (RAS), column address strobe (CAS) and write enable (W/E signals). The driver circuit 30 drives the address signals 34 and the control signals 38 and provides these signals 42 to a memory 50.

The memory 50 receives the signals 42 from the driver circuit 30 and generates the appropriate signals on a data bus 60 and a check bus 62. Memory 50 includes a plurality of memory elements. This plurality of memory elements are divided into top side memory elements 54 and bottom side memory elements 56.

Specifically, the present invention includes a plurality of memory elements, which in a preferred embodiment are 8M×8 bits DRAMs. In this embodiment, the SIMM of the present invention includes eighteen memory elements (each being 8M×8 bits) to provide 128 MB of memory. These memory elements operate at the second reference voltage (e.g., 3.3 V). As noted previously, the memory 50 is coupled to the on-board driver 30 that buffers and drives the signals received from the computer system (not shown). In this embodiment, the on-board driver 30 receives address signals and control signals and provides these signals to the memory elements. In this embodiment, there is a 16 bit wide check bus and a 128 bit wide data bus. The on-board driver 30 may be implemented using a 74LVT16244 part manufactured by Texas Instrument, Inc. This on-board driver also operates at the second reference voltage (e.g., 3.3V).

The present invention also includes a plurality of voltage regulation circuits 6 that convert a second reference voltage (e.g., the power supply voltage of the computer system) to the first reference voltage. The regulation circuit 14 ensures that the voltage and current requirements of the memory elements 50 and the driver 30 are met. Each voltage regulation circuit 16, 18 includes two linear regulators (shown hereinafter) that may be implemented using a LT1117CST part manufactured by Linear Technology.

The regulators employed in the voltage regulation circuit 14 are connected in pairs to provide current sharing. One pair of the voltage regulation circuit provides power for the memory elements mounted on one side of the SIMM, and the other pair supplies the power for the remaining memory elements on the other side of the SIMM. The details for this physical arrangement of the voltage regulators on the SIMM will be described in greater detail hereinafter.

Table 1 describes the input/output (I/O) pins for one embodiment of the present invention.

TABLE 1

| Pin Name | Description |
|---|---|
| D0 to D127 | Data bits |
| CBW0 to CBW15 | Check bits |
| A0 to A12 | Addr. bits |
| CAS0, CAS1 | Column, address strobe |
| RAS0, RAS1 | Row address strobe |
| WE | Write enable |
| VCC | +5 V supply |
| GND | ground |

Voltage Regulation

One voltage conversion solution is to have each of the four regulation circuits power an isolated group of memory elements. However, since the address and control lines join all the memory elements in this solution, these lines traverse splits in the power plane. These crossings, coupled with the simultaneous switching effects of the memory elements, and the parasitic effects of the computer components and the printed circuit board materials introduce a host of signal integrity issues and electromagnetic interference (EMI) issues.

The present invention mitigates the signal degradation due to these effects by arranging the computer components (e.g., the surface mount chips) in such a way that each side of the SIMM has a pair of voltage regulation circuits that powers the memory elements on that side. The memory elements on each side are located on a common power plane. The architecture of the present invention eliminates the need for separate power islands, but voltage regulation becomes an issue because each pair of voltage regulation circuits 6 now share the current load.

To ensure proper SIMM operation, it is important to observe the design guidelines for the linear regulator employed in the regulation circuits.

Figure 2:
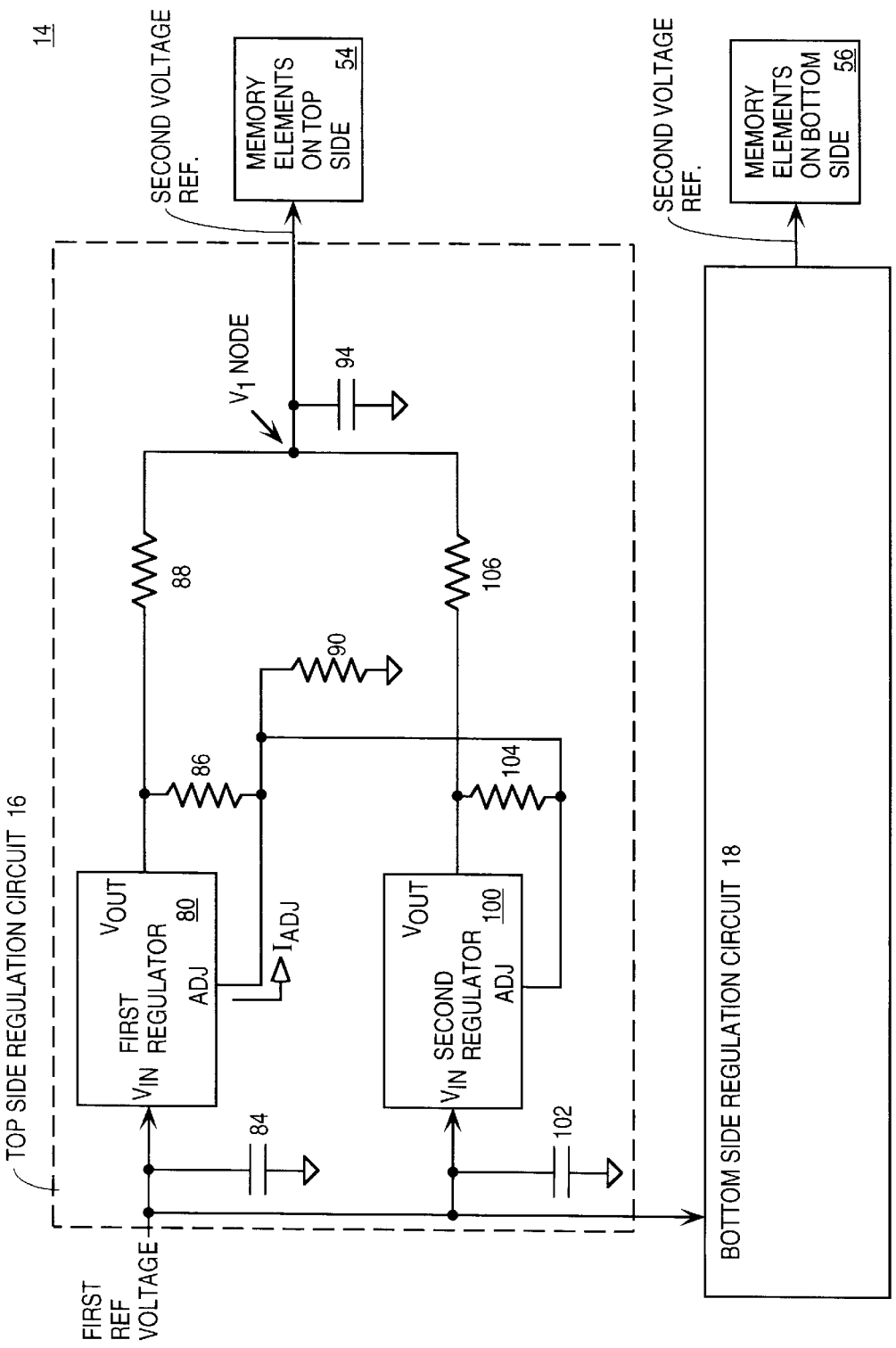
FIG. 2 illustrates a circuit diagram showing the voltage regulation circuit of the present invention.

FIG. 2 illustrates a circuit diagram showing the voltage regulation circuit of the present invention. The voltage regulation circuit 14 of the present invention includes a top side regulation circuit 16 and a bottom side regulation circuit 18. The top side regulation circuit 16 provides the second voltage reference to the top side memory elements 54. The bottom side regulation circuit 18 provides the second voltage reference to the bottom side memory elements 56. Either of these circuits 16, 18 may provide the second voltage reference to the driver circuit 30.

The specific components of the top side regulation circuit 16 will now be described. Because the components of the bottom side regulation circuit 18 mirror all the components of the top side regulation circuit 16, a description of these elements is not repeated in the discussion of the bottom side regulation circuit 18.

The top side regulation circuit 16 includes a first regulator 80 having an input for receiving the first reference voltage. The input of the first regulator 80 is also coupled to an input capacitor ($C_{in}$) 84. The first regulator 80 includes an output coupled to a first resistor (R1) 86 and a load share resistor (RS) 88. The first regulator 80 has an adjust output coupled to the other side of the first resistor (R1) 86. The adjust output of the first regulator 80 is also coupled to a second resistor (R2) 90 that is subsequently coupled to a ground reference. The load share resistor (RS) 88 and a second load share resistor (RS) 106 are coupled to a ($V_1$) node. A bulk capacitor ($C_b$) 94 is also coupled to the ($V_1$) node. The top side memory elements 54 are coupled to the ($V_1$) node and the bulk capacitor 94.

The top side regulation circuit 16 also includes a second regulator 100 that includes an input for receiving the first reference voltage. The input to the second regulator 100 is coupled to a second input capacitor ($C_{in}$) 102. The second regulator 100 includes an output coupled to a second (R1) resistor 104 and the second load share resistor (RS) 106. The other side of the second load share resistor (RS) 106 is coupled to the ($V_1$) node. The second regulator 100 includes a second (adjust) output that is coupled to the second (R1) resistor 104. The second (R1) resistor 104 is coupled to the resistor (R2) 90.

As noted previously, the bottom side regulation circuit 18 includes elements that are identical to the top side regulation circuit.

As noted previously, the voltage regulation circuit 14 of the present invention employs an input capacitor ($C_{in}$) at the input of each regulator (80, 100). The input capacitor (e.g., a 10 uF capacitor) is placed at $V_{IN}$ of each regulator to compensate for voltage sags due to input transients. In addition, computer simulations indicate that a combined bulk capacitance ($C_B$) of 100 uF located at the load of each pair of regulators provide adequate output stability and improve transient response for high current loads. Capacitors with high equivalent series resistors (ESR) degrade the transient response of the regulator. As the ESR increases, the voltage drop during transient response becomes more pronounced. Therefore, $C_B$, preferably includes capacitors having an ESR not exceeding 0.1 ohm. Although application notes for the regulators recommend that a capacitor be placed across the ADJ pin and ground to improve ripple rejection for the supply voltage, this capacitor is not needed in the present invention because the +5V input signal to the regulator originates from a regulated source. Moreover, adding this capacitor degrades the loop response of the regulator.

Since the specification of the regulator indicates a minimum load of 10 mA, R1 is chosen to satisfy this requirement (i.e., R1=$V_{REF}$/10 mA=125 ohms). Accordingly, the minimum load current for a pair of regulators is approximately 20 mA. The value of R2 may be determined from the following: R2=(3.3V−$V_{REF}$)/20 mA, where $V_{REF}$ is a 1.25V voltage reference. Solving for R2, a value of 102.5 ohms is obtained. Note that $I_{ADJ}$ is negligible and ignored in the calculations since it is only approximately 50 uA. Using standard resistor values, R1 is assigned a value of approximately 61.9 ohms, and R2 is assigned a value of approximately 105 ohms.

The current share resistor (88, 106) are important for current sharing and maintaining voltage regulation when the output of two regulators (80, 100) are tied together. Since the output voltage of the regulator is dependent on its reference voltage ($V_{REF}$) it is important to select an appropriate value for Rs to account for voltage variations in $V_{REF}$. According to computer simulations, the current sharing becomes worst as $R_S$ decreases when $V_{REF}$ and $I_{ADJ}$ are not identical for the pair of regulators. Conversely, the load current is almost shared equally among the two regulators as the value of $R_S$ increases. However, a larger $R_S$ value yields a lower load voltage. Simulation further reveals that the optimal value for $R_S$ is approximately 0.15 ohm+/−1%. It is also important for the $R_S$ resistor to have a low temperature coefficient, preferably below 100 ppm /°C.

A survey of the memory elements (e.g., 3.3V DRAMs) that may be employed by the present invention indicates that the maximum current requirement occurs during a refresh cycle and is approximately 140 mA for each 8M×8, 60 ns device. Since all eighteen memory elements (e.g., DRAMs) refresh simultaneously, the regulators are required to supply the total peak current required by the 18 DRAMs and the buffer during a refresh cycle. The peak power dissipation for the present invention can be calculated as follows (note that the average current and average power dissipation are substantially lower):

Peak Current from Regulators: (18×0.140 A)+0.200 A=2.72 A

| Peak Current from Regulators: | (18 × 0.140A) + 0.200A = | 2.72 | A |
|---|---|---|---|
| 8M × 8 DRAM, 60ns | 3.6V × (18 × 0.140A) = | 9.072 | W (0.504 W per device) |
| Buffer/Driver | 3.6V × 0.200A = | 0.720 | W |
| LT1117CST | (5.25V − 3.6V) × 2.72A = | 4.488 | W(1.122 W per device) |
| | | 14.270 | W SIMM Peak Power |

The component with the most heat dissipation (at 1.122 W/device) is the regulator. For continuous operation, it is important for the maximum junction temperature of the regulator not to exceed 125° C. since exceeding 125° C. activates the regulator's internal thermal shutdown circuitry. The junction temperature, $T_J$, is given by:

$$T_J = T_{A(max)} + P_D(@_{JA})$$

Where:
$T_{A(max)}$=maximum ambient temp.=50° C.
$P_D$=power dissipation
$@_{JA}$=thermal resistance, junction to ambient $T_J=50°$ C.$+1.122$ W($@_{JA}$)$=125°$ C.
$@_{JA}=(125°$ C.$-50°$ C.$)/1.122$ W$=66.845°$C./W According to the above calculations, $@_{JA}$ can not exceed 66.845° C. in order to satisfy the maximum allowed $T_J$.

The present invention uses the printed circuit (PC) material as a way of transmitting heat between the pad area, attached to the tab of the device, and through resistance to the power plane layer, located inside or on the opposite side of the board. The present invention dissipates heat by selecting an appropriate copper area for the power plane that yields a thermal characteristic of $@_{JA}<66.845°$ C.

In one embodiment of the present invention, the height allowed on top of the SIMM is approximately 0.068". Furthermore, surface mount packages for the components are used. Note that the tab of the SOT-223 package for the regulator is also $V_{OUT}$. The present invention effectively dissipates heat from the regulators and distributes current to the memory elements (DRAMs) by connecting this tab to a copper plane on which the DRAMs reside. Details of the component placement and layer stacking are discussed hereinafter.

The present invention employs judicious component placement and printed circuit board (PCB) layer stacking to obtain very good thermal results and signal integrity. If 9 DRAMs are placed with a pair of regulators on each side of the DSIMM, a printed circuit layer stacking may be implemented, as the one shown in FIG. 3. Specifically, the 5V input plane and the 3V output plane share the same layers, but the signal tracks do not cross splits in these planes. Consequently, signal degradation due to parasitic effects, as well as material parameters, is minimized since the address and controls lines can be routed without crossing any power plane boundaries. The printed circuit board includes signal layers 200, 204, 210, and 224. The printed circuit board also includes power layer 202, and 220. Moreover, the printed circuit board includes ground layers 206 and 208. In this embodiment, there is a dielectric layer between all signal layers and power layers.

Figure 4:
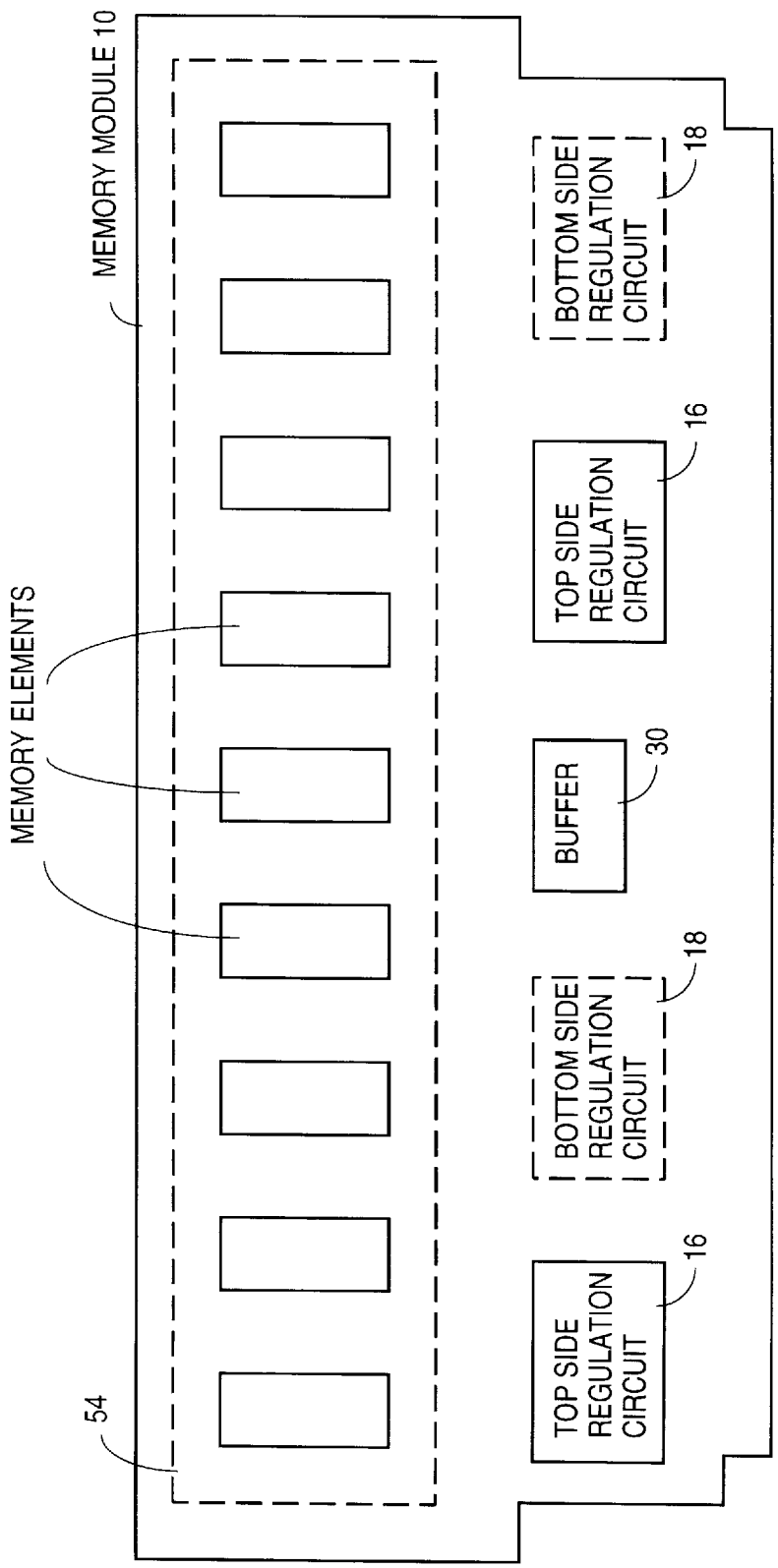
FIG. 4 illustrates the physical component placement for one embodiment of the present invention.

FIG. 4 illustrates the physical component placement for one embodiment of the memory module 10 of the present invention. The top side of the memory module 10 includes the top side memory elements 54. Moreover, the top side of the memory module 10 of the present invention includes the top side regulation circuit 16, which may be physically separated into two blocks as shown. Also, a buffer or driver circuit 30 is disposed on the top side.

The bottom side of the memory module of the present invention includes the bottom side memory elements 56 (not shown) and the bottom side regulation circuit 18, which may be physically separated into two physical locations on the bottom side.

Figure 5:
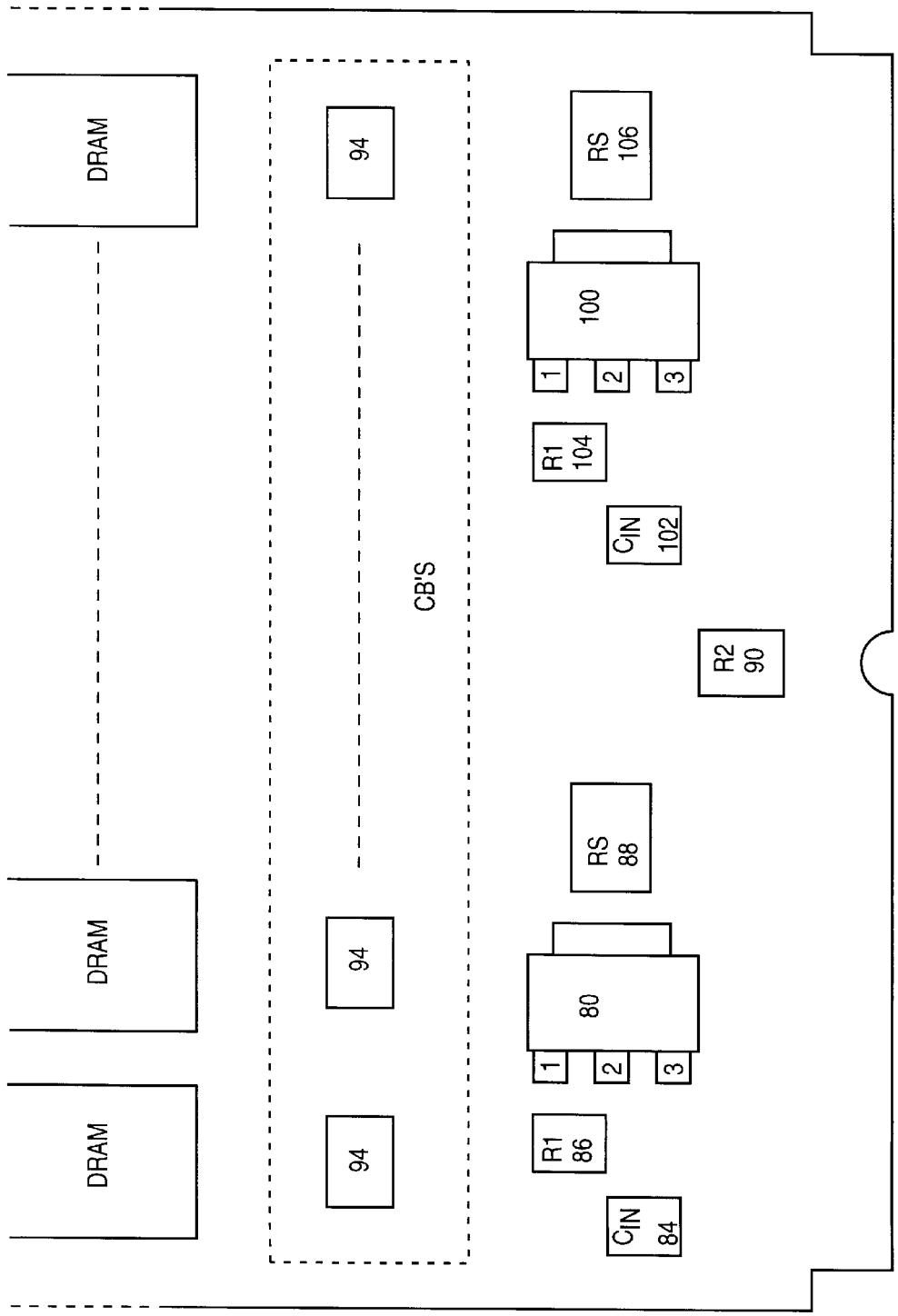
FIG. 5 illustrates the physical component placement of the components of the voltage regulation circuit of one embodiment of the present invention.

FIG. 5 illustrates the physical component placement of the components of the voltage regulation circuit of one embodiment of the present invention. The top side regulation circuit 16 includes the first regulator 80, and associated resistors (R1) 86, (R2) 90, and capacitor ($C_{in}$) 84 and current share resistor RS 88. FIG. 5 also illustrates the placement of the second regulator 100, along with the associated ($C_{in}$) 102, (R1) 104, and ($R_S$) 106. In this embodiment $C_B$ 94 is implemented by using ten (10)×10 uF capacitors. The current share resistors 88 and 106 are coupled to the second voltage reference plane (e.g., 3.3V plane).

Figure 6:
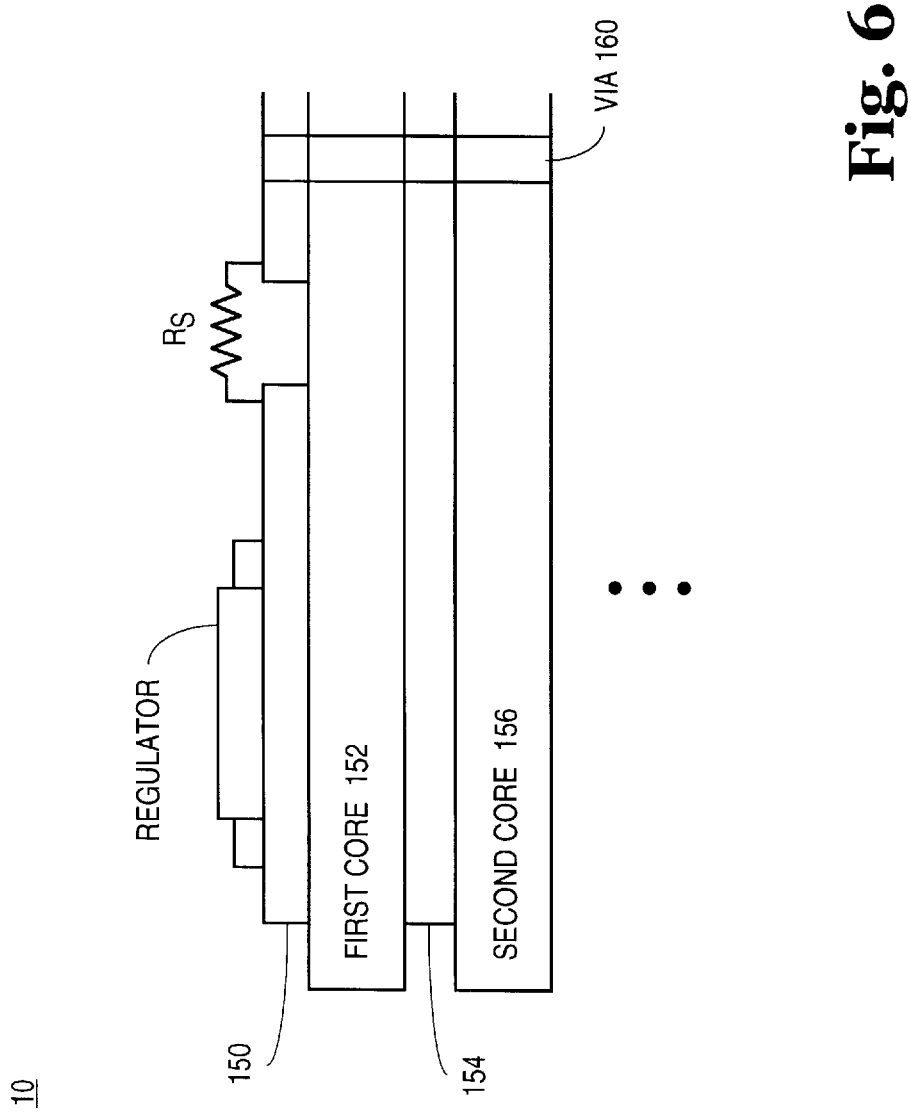
FIG. 6 illustrates a sectional view of the internal layers of the memory module of the present invention.

FIG. 6 illustrates sectional view of the internal layers of the memory module of the present invention. The power layer 202, illustrated in FIG. 3, includes a top copper layer 150, a first core 152 disposed beneath the top copper layer 150, a power plane 154, disposed under the first core 152, and a second core 156, disposed under the power plane 154. A regulator (e.g., 80, 100) of the present invention, is disposed on the top copper layer 150. A load share resistor ($R_S$) (e.g., 88 or 106) is also disposed on the top copper layer. FIG. 6 also illustrates a via 160 that couples the top copper layer 150 to the first core 152, the power plane 154, and the second core 156. Although not shown in FIG. 6, beneath the second core 156 are additional signal, ground, power and dielectric layers, as illustrated in FIG. 3.

Figure 7:
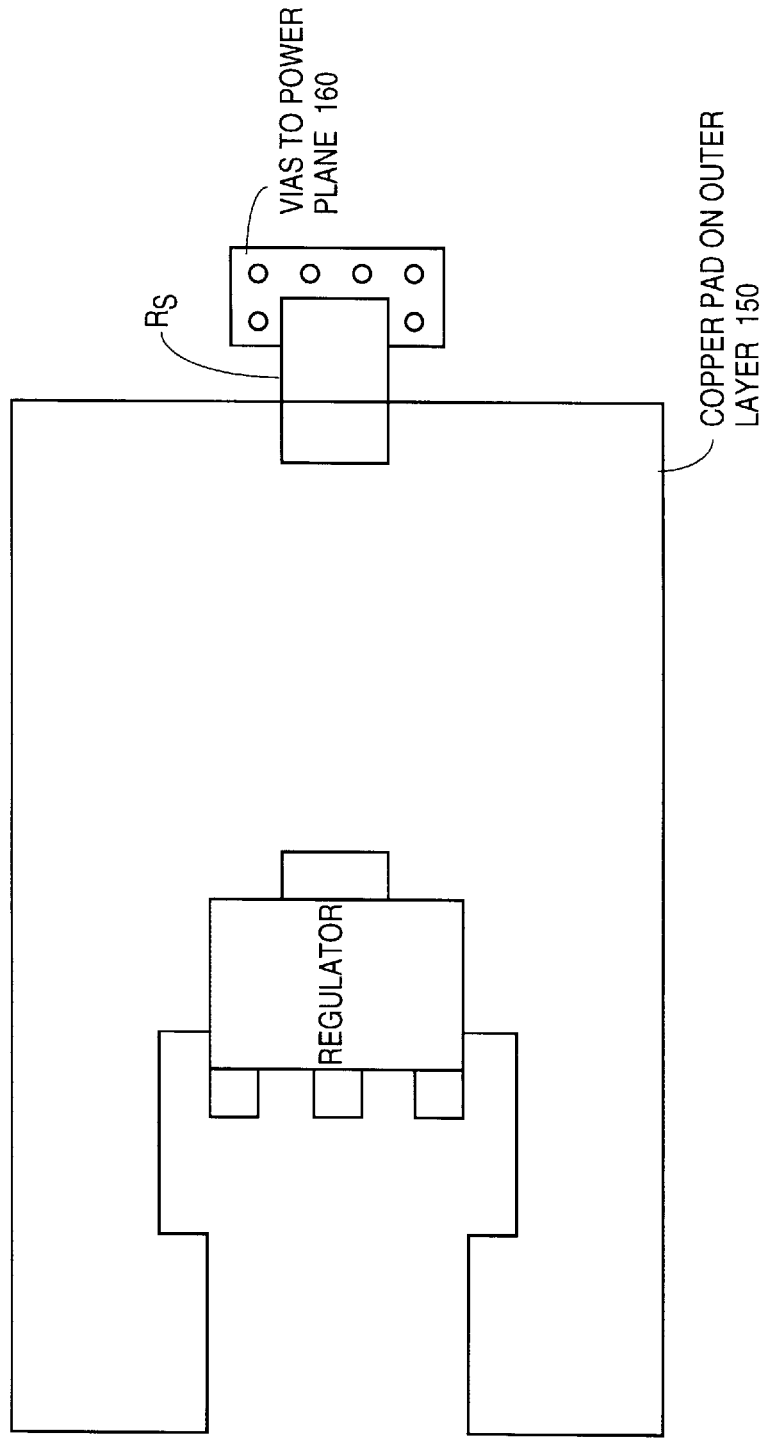
FIG. 7 illustrates the metal pad surrounding each of the regulators employed by the memory module of the present invention.

FIG. 7 illustrates the metal pad 150 surrounding each of the regulators employed the present invention. The metal layer or pad 150 surrounds each of the regulators to create a first order heat sink on the outer layer for each of the regulators. This metal pad may be formed out of copper. Specifically, FIG. 7 illustrates the copper pad 150 on the outer layer, vias 160 to the power plane, the load share resistor ($R_S$) and also the regulator of the present invention.

FIG. 8 illustrates a side view of multiple memory modules of the present invention that are configured in accordance with the teachings of the present invention. A first memory module 180 and a second memory module 182 are configured in a computer system. FIG. 8 does not show the DRAMS, which are also mounted on the printed circuit board, in order to simplify this figure. The regulators 184 of the present invention, are staggered in their placement on the printed circuit board so that they will not pre-heat each other. For example, on the first memory module 180, a first regulator 186 is physically disposed on the opposite side of a second regulator 188. Moreover, the present invention configures the first regulator 186 so that it is physically offset from the second regulator 188. In other words, the first regulator 186 is not configured to be in a physical location that is directly opposite the second regulator 188. Accordingly, for each memory module 180 or 182, the regulators on those memory modules are placed in such a way so that they are staggered along the length of the memory module.

Furthermore, the present invention insures that the regulators on adjacent memory modules (180, 182) are not placed directly opposite of each other, but are instead also staggered (i.e., a first regulator 186 of the first memory module 180 is physically offset from a first regulator 190 of a second memory module 182. By employing this specific staggered placement of the regulators for each memory module and with respect to adjacent memory modules, the present invention effectively deals with the build-up of heat and effectively addresses the thermal considerations of a memory module having more than one regulator chip on board and also the heat generated by a computer system having multiple memory modules.

In this embodiment, the regulators are positioned near a connector edge (not shown) that provides a connection between the SIMM and the computer system and offset from the regulators on its opposite side as described previously for more efficient heat dissipation. To facilitate thermal cooling, the tab of each pair of regulator package is coupled onto a common copper power plane. The two outer layers are used as power planes since they exhibit better thermal conductivity than the internal layers. The copper power plane acts as a thermal conductive surface allowing heat to transfer from the DRAMS to the printed circuit board (PCB). $R_S$ may be a discrete resistor or may be composed of printed circuit materials, such as vias, depending on how small a resistor value is needed. In this embodiment, $R_S$ is a discrete resistor because of the amount of resistance needed and power consideration. $R_S$ acts as the medium and current distribution to the power plane.

In the foregoing specification, the invention has been described with reference to specific exemplary embodiments thereof. It will however be evident that various modifications and changes may be made thereto without departing from the broader spirit and scope of the invention as set forth in the appended claims. The specification and drawings are accordingly to be regarded as illustrative rather than restrictive.

APPENDIX 1

| Pin No. | Pin Name | Pin No. | Pin Name | Pin No. | Pin Name | Pin No. | Pin Name | Pin No. | Pin Name | Pin No. | Pin Name | Pin No. | Pin Name | Pin No. | Pin Name |
|---|---|---|---|---|---|---|---|---|---|---|---|---|---|---|---|
| 1 | GND | 26 | D13 | 51 | D49 | 76 | CBW7 | 101 | GND | 126 | CBW12 | 151 | VCC | 176 | D118 |
| 2 | GND | 27 | D11 | 52 | D54 | 77 | CBW1 | 102 | GND | 127 | D64 | 152 | VCC | 177 | D114 |
| 3 | D0 | 28 | D12 | 53 | D50 | 78 | CBW6 | 103 | A6 | 128 | D71 | 153 | D75 | 178 | D117 |
| 4 | D7 | 29 | D40 | 54 | D53 | 79 | CBW2 | 104 | A7 | 129 | D65 | 154 | D76 | 179 | D115 |
| 5 | D1 | 30 | D47 | 55 | D51 | 80 | CBW5 | 105 | A8 | 130 | D70 | 155 | D104 | 180 | D116 |
| 6 | D6 | 31 | D41 | 56 | D52 | 81 | VCC | 106 | A9 | 131 | D66 | 156 | D111 | 181 | D88 |
| 7 | D2 | 32 | D46 | 57 | D24 | 82 | VCC | 107 | A10 | 132 | D69 | 157 | D105 | 182 | D95 |
| 8 | D5 | 33 | GND | 58 | D31 | 83 | CBW3 | 108 | A11 | 133 | D67 | 158 | D110 | 183 | VCC |
| 9 | D3 | 34 | GND | 59 | D25 | 84 | CBW4 | 109 | A12 | 134 | D68 | 159 | D106 | 184 | VCC |
| 10 | D4 | 35 | D42 | 60 | D30 | 85 | CAS0 | 110 | WE | 135 | GND | 160 | D109 | 185 | D89 |
| 11 | D32 | 36 | D45 | 61 | D26 | 86 | CAS1 | 111 | NC | 136 | GND | 161 | D107 | 186 | D94 |
| 12 | D39 | 37 | D43 | 62 | D29 | 87 | RAS0 | 112 | NC | 137 | D96 | 162 | D108 | 187 | D90 |
| 13 | D33 | 38 | D44 | 63 | D27 | 88 | RAS1 | 113 | GND | 138 | D103 | 163 | D80 | 188 | D93 |
| 14 | D38 | 39 | D16 | 64 | D28 | 89 | NC | 114 | GND | 139 | D97 | 64 | D87 | 189 | D91 |
| 15 | D34 | 40 | D23 | 65 | GND | 90 | NC | 115 | GND | 140 | D102 | 165 | D81 | 190 | D92 |
| 16 | D37 | 41 | D17 | 66 | GND | 91 | NC | 116 | GND | 141 | D98 | 166 | D86 | 191 | D120 |
| 17 | VCC | 42 | D22 | 67 | D56 | 92 | NC | 117 | CBW8 | 142 | D101 | 167 | GND | 192 | D127 |
| 18 | VCC | 43 | D18 | 68 | D63 | 93 | A0 | 118 | CBW15 | 143 | D99 | 168 | GND | 193 | D121 |
| 19 | D35 | 44 | D21 | 69 | D57 | 94 | A1 | fl9 | VCC | 144 | D100 | 169 | D82 | 194 | D126 |
| 20 | D36 | 45 | D19 | 70 | D62 | 95 | A2 | 120 | VCC | 145 | D72 | 170 | D85 | 195 | D122 |
| 21 | D8 | 46 | D20 | 71 | D58 | 96 | A3 | 121 | CBW9 | 146 | D79 | 171 | D83 | 196 | D125 |
| 22 | D15 | 47 | D48 | 72 | D61 | 97 | A4 | 122 | CBW14 | 147 | D73 | 172 | D84 | 197 | D123 |
| 23 | D9 | 48 | D55 | 73 | D59 | 98 | A5 | 123 | CBW10 | 148 | D78 | 173 | D112 | 198 | D124 |
| 24 | D14 | 49 | VCC | 74 | D60 | 99 | GND | 124 | CBW13 | 149 | D74 | 174 | D119 | 199 | GND |
| 25 | D10 | 50 | VCC | 75 | CBW0 | 100 | GND | 125 | CBW11 | 150 | D77 | 175 | D113 | 200 | GND |

What is claimed is:

1. A single in-line memory module having a plurality of data conductors, said data conductors including a first set for receiving signals and a second set for transmitting signals, one conductor of the first set for receiving a first reference voltage, said single in-line memory module comprising:
   a) a printed circuit board;
   b) a plurality of memory elements mounted on said printed circuit board, wherein said memory elements operate at a second reference voltage;
   c) a driver circuit mounted on the printed circuit board, said driver circuit receiving a set of control and address signals of the first set and transmitting these signals to the memory elements, wherein said driver circuit operates at said second reference voltage; and
   d) a voltage regulation circuit, mounted on the printed circuit board and coupled to at least one memory element, said voltage regulation circuit converting the first reference voltage into said second reference voltage and providing the second reference voltage to the memory elements and the driver circuit.

2. The single in-line memory module of claim 1 wherein the printed circuit board includes a first surface and a second surface;
   wherein the voltage regulation circuit further includes a first surface regulation circuit, disposed on the first surface of said printed circuit board and a second surface regulation circuit, disposed on the second surface of said printed circuit board;
   wherein said plurality of memory elements mounted on said printed circuit board includes a first plurality of memory elements mounted on the first surface and a second plurality of memory elements mounted on the second surface;
   wherein the first surface regulation circuit provides the second reference voltage to the first plurality of memory elements, disposed on the first surface, and the second surface regulation circuit provides the second reference voltage to the second plurality of memory elements disposed on the second surface.

3. The single in-line memory module of claim 2 wherein the first surface regulation circuit includes a first regulator having a first input coupled to the first reference voltage, a second input for adjusting said first regulator, and an output for providing the second reference voltage to the first plurality of memory elements disposed on the first surface.

4. The single in-line memory module of claim 3 wherein the first input is coupled to a capacitor, the second input is coupled to a first resistor, and the output is coupled to a first load share resistor.

5. The single in-line memory module of claim 4 wherein the first surface regulation circuit further includes a second regulator having a first input for receiving the first reference voltage, a second input for receiving a control signal, and an output for providing the second reference voltage to the first plurality of memory elements disposed on the first surface.

6. The single in-line memory module of claim 5 wherein the first input of the second regulator is coupled to an input capacitor, the second input is coupled to the first resistor, and the output of the second regulator is coupled to a second load share resistor.

7. The single in-line memory module of claim 2 wherein the second surface regulation circuit comprises
   a first regulator having an input coupled to the first reference voltage, a second input for adjusting said first regulator, and an output for providing the second reference voltage to the second plurality of memory elements disposed on the second surface; and
   a second regulator having an input coupled to the first reference voltage, a second input for adjusting said second regulator, and an output for providing the second reference voltage to the second plurality of memory elements disposed on the second surface.

8. The single in-line memory module of claim 1 wherein the memory elements of said memory module provide 128 megabytes of memory storage space.

9. The single in-line memory module of claim 2 wherein there are nine memory elements mounted on said first surface and nine memory elements are mounted on said second surface.

10. The single in-line memory module of claim 2 wherein there are two regulators mounted on said first surface and two regulators mounted on said second surface.

11. The single in-line memory module of claim 1 wherein the first reference voltage is approximately 5 volts, and the second reference voltage is approximately 3.3 volts.

12. A single in-line memory module for memory expansion in a computer system having a memory bus with n data lines and an input for receiving a first reference voltage, said single in-line memory module comprising the elements of:
 a printed circuit board, said printed circuit board having a first side and a second side, said printed circuit board having an electrical connector, said electrical connector including a first set of electrical contacts on said first side of said printed circuit board and a second set of electrical contacts on said second side of said printed circuit board, wherein said electrical connector includes a full width data path;
 a first set of memory elements arranged on said printed circuit board;
 a second set of memory elements arranged on said printed circuit board, said first and second set of memory elements having a total of at least n data lines; wherein said first set of memory elements and said second set of memory elements operate at a second reference voltage;
 a voltage regulation circuit, arranged on said printed circuit board and coupled to at least one memory element of said first and second set of memory elements, said voltage regulation circuit converting the first reference voltage into the second reference voltage and providing the second reference voltage to the memory elements; and
 a set of control signals in said electrical connector electrically coupled to said first set of memory elements and said second set of memory elements.

13. A single in-line memory module for memory expansion in a computer system having a memory bus and an input for receiving a first reference voltage, said single in-line memory module comprising the elements of:
 a printed circuit board, said printed circuit board having a first side and a second side, said printed circuit board having an electrical connector, said electrical connector including a first set of electrical contacts on said first side of said printed circuit board and a second set of electrical contacts on said second side of said printed circuit board;
 a first set of memory elements arranged on said printed circuit board;
 a driver circuit mounted on said printed circuit board, said driver circuit coupled to a set of control signals in said electrical connector, said driver circuit transmitting said control signals to said first set of memory elements; wherein said first set of memory elements and said driver circuit operate at a second reference voltage; and
 a voltage regulation circuit, mounted on said printed circuit board and coupled to at least one memory element of said first set of memory elements and said driver circuit, said voltage regulation circuit converting the first reference voltage into the second reference voltage and providing the second reference voltage to the memory elements and the driver circuit;
 wherein said first set of electrical contacts and said second set of electrical contacts are electrically distinct.

14. A single in-line memory module for memory expansion in a computer system having a memory bus and an input for receiving a first reference voltage; said single in-line memory module comprising the elements of:
 a printed circuit board, said printed circuit board having a first side and a second side, said printed circuit board having an electrical connector, said electrical connector including a first set of electrical contacts on said first side of said printed circuit board and a second set of electrical contacts on said second side of said printed circuit board;
 a first set of memory elements arranged on said first side of said printed circuit board, said first set of memory elements coupled to said first set of electrical contacts;
 a second set of memory elements arranged on said second side of said printed circuit board, said second set of memory elements coupled to said second set of electrical contacts;
 a driver circuit mounted on said printed circuit board, said driver circuit coupled to a set of control signals in said electrical connector, said driver circuit transmitting said control signals to said first and second set of memory elements; wherein said first set of memory elements, said second set of memory elements, and said driver circuit operate at a second reference voltage; and
 a voltage regulation circuit, mounted on said printed circuit board and coupled to at least one memory element of said first and second set of memory element and said driver circuit, said voltage regulation circuit converting the first reference voltage into the second reference voltage and providing the second reference voltage to the memory elements and the driver circuit;
 wherein said first set of electrical contacts and said second set of electrical contacts are electrically distinct.

15. A single in-line memory module for memory expansion in a computer system having a memory bus and an input for receiving a first reference voltage, said single in-line memory module comprising the elements of:
 a printed circuit board, said printed circuit board having a first side and a second side, said printed circuit board having an electrical connector, said electrical connector having a first set of electrical contacts and a second set of electrical contacts;
 a first set of memory elements arranged on said printed circuit board;
 a driver circuit mounted on said printed circuit board, said driver circuit coupled to a set of control signals in said electrical connector, said driver circuit transmitting said controls signals to said first set of memory elements; wherein said memory elements and said driver circuit operate at a second reference voltage; and
 a voltage regulation circuit, mounted on said printed circuit board and coupled to at least one memory element of said first set of memory elements and said driver circuit, said voltage regulation circuit converting the first reference voltage into the second reference voltage and providing the second reference voltage to the memory elements and the driver circuit;

wherein said first set of electrical contacts and said second set of electrical contacts are electrically distinct.

16. A single in-line memory module for memory expansion in a computer system having a memory bus with n data lines and an input for receiving a first reference voltage, said single in-line memory module comprising the elements of:

a printed circuit board, said printed circuit board having a first side and a second side, said printed circuit board having an electrical connector, said electrical connector including a first set of electrical contacts on said first side of said printed circuit board and a second set of electrical contacts on said second side of said printed circuit board;

a first set of memory elements arranged on said first side of said printed circuit board, said first set of memory elements having a total of at least n data lines;

a driver circuit mounted on said printed circuit board, said driver circuit coupled to a set of control signals in said electrical connector, said driver circuit transmitting said control signals to said first set of memory elements; wherein said memory elements and said driver circuit operate at a second reference voltage; and a voltage regulation circuit, mounted on said printed circuit board and coupled to at least one memory element of said first set of memory elements and said driver circuit, said voltage regulation circuit converting the first reference voltage into the second reference voltage and providing the second reference voltage to the memory elements and the driver circuit;

wherein said first set of electrical contacts and said second set of electrical contacts are electrically distinct.

17. A single in-line memory module for memory expansion in a computer system having a memory bus and an input for receiving a first reference voltage, said single in-line memory module comprising the elements of:

a printed circuit board, said printed circuit board having a first side and a second side, said printed circuit board having an electrical connector, said electrical connector including a first set of electrical contacts on said first side of said printed circuit board and a second set of electrical contacts on said second side of said printed circuit board;

a first set of memory elements arranged on said first side of said printed circuit board, said first set of memory elements coupled to said first set of electrical contacts;

a second set of memory elements arranged on said second side of said printed circuit board, said second set of memory elements coupled to said second set of electrical contacts;

a driver circuit mounted on said printed circuit board, said driver circuit coupled to a set of control signals in said electrical connector, said driver circuit transmitting said control signals to said first and second set of memory elements; wherein said first set of memory elements, said second set of memory elements, and said driver circuit operate at a second reference voltage; and a voltage regulation circuit, mounted on said printed circuit board and coupled to at least one memory element of said first and second set of memory elements and said driver circuit, said voltage regulation circuit converting the first reference voltage into the second reference voltage and providing the second reference voltage to the memory elements and the driver circuit;

wherein said first set of electrical contacts and said second set of electrical contacts are electrically distinct.

18. A single in-line memory module for memory expansion in a computer system having a memory bus with n data lines and an input for receiving a first reference voltage, said single in-line memory module comprising the elements of:

a printed circuit board, said printed circuit board having a first side and a second side, said printed circuit board having an electrical connector, said electrical connector having a first set of electrical contacts and a second set of electrical contacts;

a first set of memory elements arranged on said printed circuit board, said first set of memory elements having a total of at least n data lines; and a driver circuit mounted on said printed circuit board, said driver circuit coupled to a set of control signals in said electrical connector, said driver circuit transmitting said control signals to said first set of memory elements; wherein said memory elements and said driver circuit operate at a second reference voltage; and a voltage regulation circuit, mounted on said printed circuit board and coupled to at least one memory element of said first set of memory elements and said driver circuit, said voltage regulation circuit converting the first reference voltage into the second reference voltage and providing the second reference voltage to the memory elements and the driver circuit;

wherein said first set of electrical contacts and said second set of electrical contacts are electrically distinct.

19. A single in-line memory module for memory expansion in a computer system having a memory bus and an input for receiving a first reference voltage, said single in-line memory module comprising the elements of:

a printed circuit board, said printed circuit board having a first side and a second side, said printed circuit board having an electrical connector, said electrical connector including a first set of electrical contacts on said first side of said printed circuit board and a second set of electrical contacts on said second side of said printed circuit board;

a first set of memory elements arranged on said printed circuit board, said first set of memory elements having a total of at least n data lines;

a driver circuit mounted on said printed circuit board, said driver circuit coupled to a set of control signals in said electrical connector, said driver circuit transmitting said control signals to said first set of memory elements; wherein said memory elements and said driver circuit operate at a second reference voltage; and a voltage regulation circuit, mounted on said printed circuit board and coupled to at least one memory element of said first set of memory elements and said driver circuit, said voltage regulation circuit converting the first reference voltage into the second reference voltage and providing the second reference voltage to the memory elements and the driver circuit;

wherein said electrical connector includes a full width data path such that one of said single in-line memory modules increases a main memory in said computer system.

20. A memory structure for a computer system comprising:

an integrated video and data memory bus with n data lines; and at least one single in-line memory module having a memory bus with n data lines and an input for receiving a first reference voltage, said single in-line memory module including:

a printed circuit board, said printed circuit board having a first side and a second side, said printed circuit board having an electrical connector, said electrical connector including a first set of electrical contacts on said first side of said printed circuit board and a second set of electrical contacts on said second side of said printed circuit board;

a first set of memory elements arranged on said printed circuit board;

a second set of memory elements arranged on said printed circuit board, said first and second set of memory elements configured for integrated data and video storage and having a total of at least n data lines including a full width data path; a set of control signals in said electrical connector electrically coupled to said first set of memory elements and said second set of memory elements; wherein said memory elements operate at a second reference voltage; and a voltage regulation circuit, arranged on said printed circuit board and coupled to at least one memory element of said first and second set of memory elements, said voltage regulation circuit converting the first reference voltage into the second reference voltage and providing the second reference voltage to the memory elements.

21. A memory structure for a computer system comprising:

an integrated video and data memory bus with n data lines; and at least one single in-line memory module having an input for receiving a first reference voltage, said single in-line memory module including:

a printed circuit board, said printed circuit board having a first side and a second side, said printed circuit board having an electrical connector, said electrical connector including a first set of electrical contacts on said first side of said printed circuit board and a second set of electrical contacts on said second side of said printed circuit board;

a first set of memory elements arranged on said printed circuit board and configured for integrated data and video storage;

a driver circuit mounted on said printed circuit board, said driver circuit coupled to a set of control signals in said electrical connector, said driver circuit transmitting said control signals to said first set of memory elements; wherein said first set of memory elements, and said driver circuit operate at a second reference voltage; and a voltage regulation circuit, mounted on said printed circuit board and coupled to at least one memory element of said first set of memory elements and said driver circuit, said voltage regulation circuit converting the first reference voltage into the second reference voltage and providing the second reference voltage to the memory elements and the driver circuit;

wherein said first set of electrical contacts and said second set of electrical contacts are electrically distinct.

22. A single in-line memory module for memory expansion in a computer system having a memory bus, said single in-line memory module having an input for receiving a first reference voltage, said single in-line memory module comprising the elements of:

a printed circuit board, said printed circuit board having a first side and a second side, said printed circuit board having an electrical connector, said electrical connector including a first set of electrical contacts on said first side of said printed circuit board and a second set of electrical contacts on said second side of said printed circuit board;

a first set of memory elements arranged on said printed circuit board; wherein said memory elements operate at a second reference voltage; and a voltage regulation circuit, arranged on said printed circuit board and coupled to at least one memory element of said first set of memory elements, said voltage regulation circuit converting the first reference voltage into the second reference voltage and providing the second reference voltage to the memory elements; wherein said first set of electrical contacts and said second set of electrical contacts are electrically distinct.

* * * * *